United States Patent
DeJarnatt et al.

(10) Patent No.: US 10,753,654 B2
(45) Date of Patent: Aug. 25, 2020

(54) RAIL COOLING SYSTEM AND METHOD FOR REDUCING THERMAL EXPANSION

(71) Applicant: Siemens Industry, Inc., Alpharetta, GA (US)

(72) Inventors: Barton DeJarnatt, Louisville, KY (US); Travis Pless, Waddy, KY (US)

(73) Assignee: SIEMENS MOBILITY, INC., New York, NY (US)

( * ) Notice: Subject to any disclaimer, the term of this patent is extended or adjusted under 35 U.S.C. 154(b) by 135 days.

(21) Appl. No.: 15/563,803

(22) PCT Filed: Jan. 25, 2016

(86) PCT No.: PCT/US2016/014658
§ 371 (c)(1),
(2) Date: Oct. 2, 2017

(87) PCT Pub. No.: WO2016/164093
PCT Pub. Date: Oct. 13, 2016

(65) Prior Publication Data
US 2018/0087811 A1     Mar. 29, 2018

Related U.S. Application Data

(60) Provisional application No. 62/143,349, filed on Apr. 6, 2015.

(51) Int. Cl.
*H01L 35/30* (2006.01)
*F25B 21/04* (2006.01)
(Continued)

(52) U.S. Cl.
CPC ............... *F25B 21/04* (2013.01); *B61L 1/02* (2013.01); *E01B 19/00* (2013.01); *H01L 35/30* (2013.01);
(Continued)

(58) Field of Classification Search
CPC . H01L 35/00–34; H01L 27/16; B61L 1/00–20
(Continued)

(56) References Cited

U.S. PATENT DOCUMENTS

2005/0121064 A1* 6/2005 Seo .................. H01L 23/38
136/200
2006/0243317 A1 11/2006 Venkatasubramanian
(Continued)

FOREIGN PATENT DOCUMENTS

| EP | 2269888 A1 | 1/2011 |
| EP | 2757605 A2 | 7/2014 |
| JP | 3171039 U | 10/2011 |

OTHER PUBLICATIONS

PCT International Search Report and Written Opinion of International Searching Authority dated May 3, 2016 corresponding to PCT International Application No. PCT/US2016/014658 filed Jan. 25, 2016.

*Primary Examiner* — Bach T Dinh

(57) ABSTRACT

A thermal energy removal system is provided to cool a rail of a railway track in a self-powered mode and/or an externally-powered mode. The system comprises a cooling module configured to mount on a side of the rail to remove heat stored inside the rail. The cooling module includes a solid state electrical insulation sandwiched between a plate and a heat sink. The cooling module further includes a first terminal and a second terminal. The first and second terminals to provide an electric energy source based on the heat extracted and harnessed for powering at least one of an electronic circuit, a light source, and a communication device associated with railways infrastructure.

9 Claims, 5 Drawing Sheets

(51) Int. Cl.
  *B61L 1/02*   (2006.01)
  *E01B 19/00*  (2006.01)
  *H01L 35/00*      (2006.01)
  *B61L 11/00*      (2006.01)
  *B61L 13/00*      (2006.01)
  *B61L 1/20*       (2006.01)

(52) U.S. Cl.
  CPC ............... *B61L 1/20* (2013.01); *B61L 11/00* (2013.01); *B61L 13/00* (2013.01); *F25B 2321/021* (2013.01); *F25B 2321/023* (2013.01); *F25B 2321/0212* (2013.01); *H01L 35/00* (2013.01)

(58) Field of Classification Search
  USPC .................................................. 136/200–242
  See application file for complete search history.

(56) References Cited

U.S. PATENT DOCUMENTS

| | | | |
|---|---|---|---|
| 2010/0127299 A1* | 5/2010 | Smith | ............... H01L 35/28 |
| | | | 257/99 |
| 2010/0163090 A1 | 7/2010 | Liu et al. | |
| 2012/0096871 A1* | 4/2012 | Wang | ............... F25B 21/02 |
| | | | 62/3.2 |
| 2014/0033755 A1 | 2/2014 | Wong | |

* cited by examiner

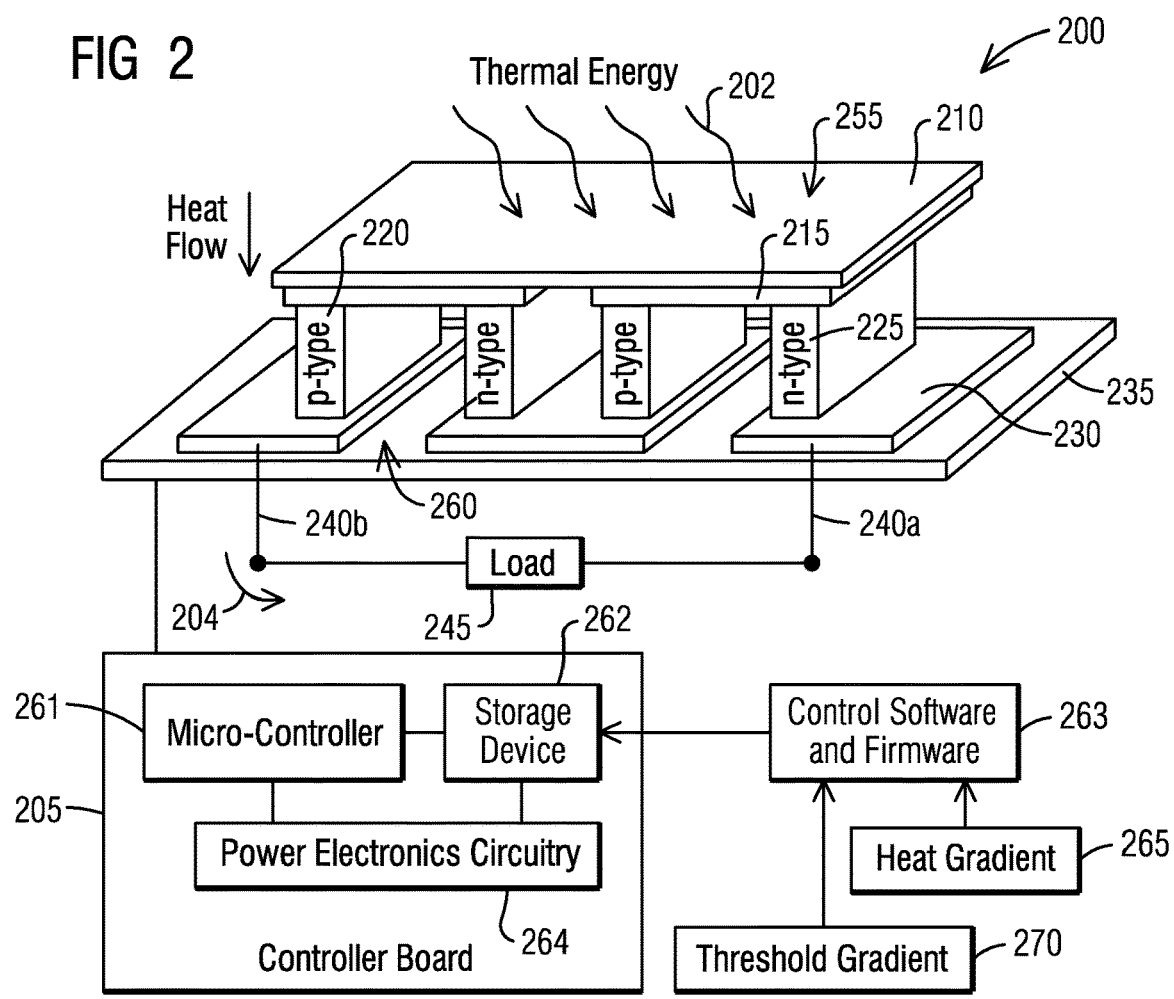
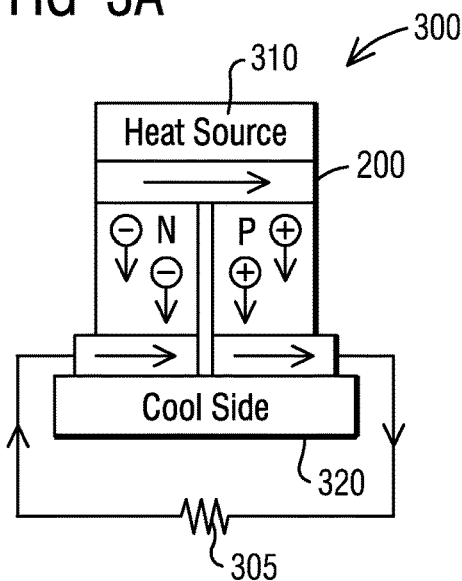
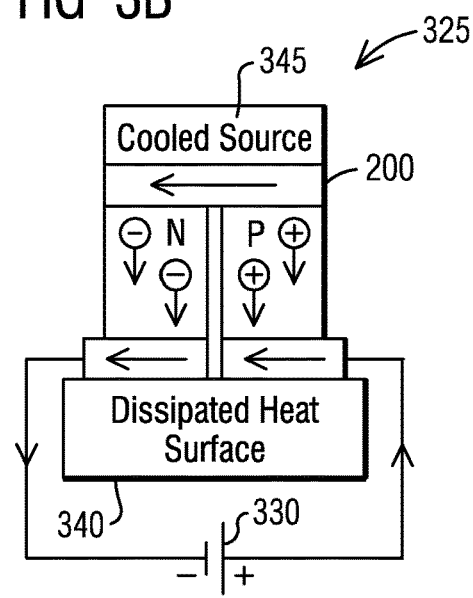

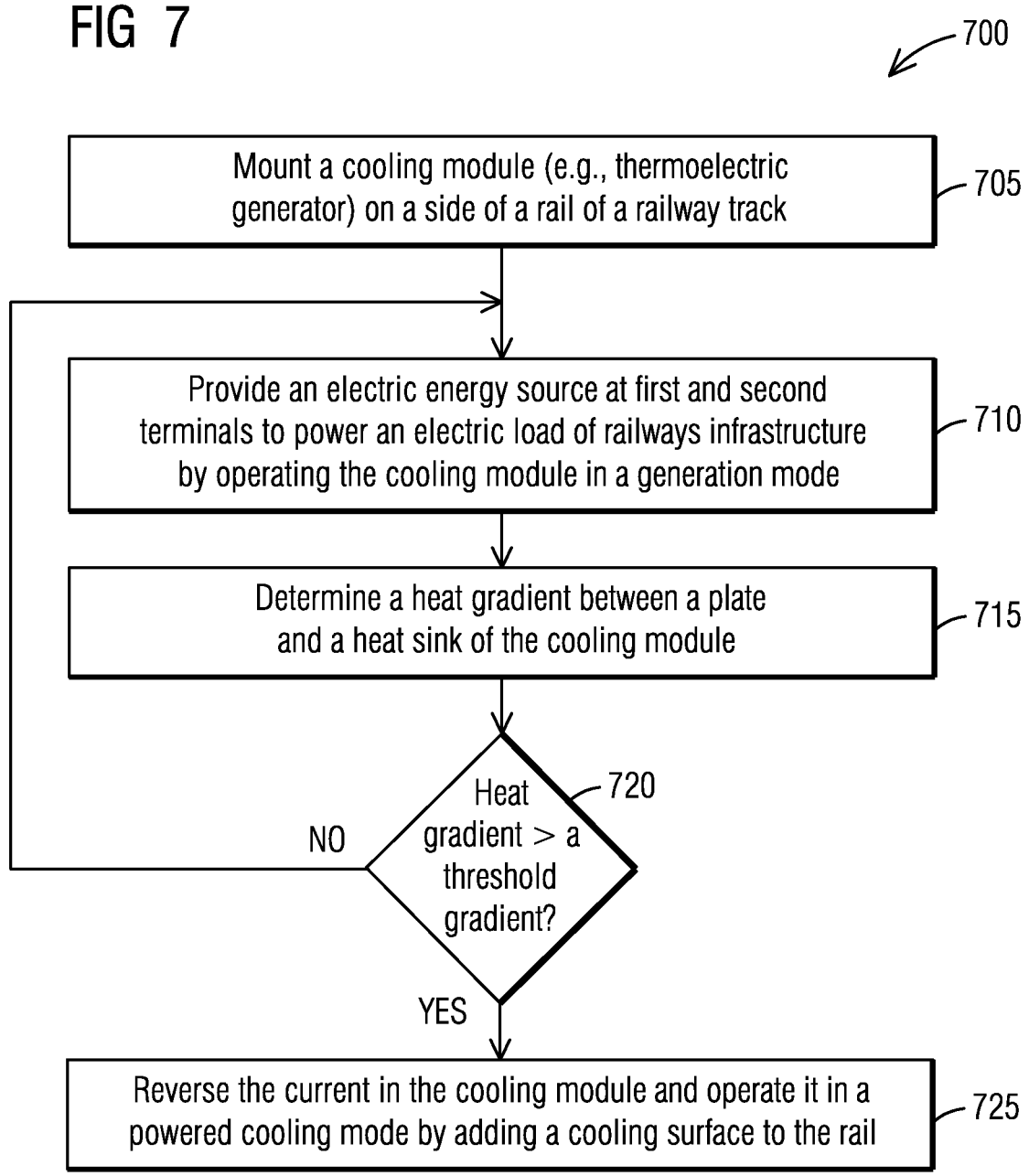

RAIL COOLING SYSTEM AND METHOD FOR REDUCING THERMAL EXPANSION

CROSS REFERENCE TO RELATED APPLICATIONS

This application claims the benefit of U.S. Provisional Application Ser. No. 62/143,349 entitled "RAILROAD RAIL BUCKLE PREVENTION USING THERMOELECTRIC GENERATOR," filed on Apr. 6, 2015, the contents of which are hereby incorporated by reference herein in their entirety.

BACKGROUND

1. Field

Aspects of the present invention generally relate to altering condition of a railways installation such as a railway track and more specifically relates to a cooling device for removing thermal energy from rails of the railway track to avoid detrimental conditions for railroad operations and reduce track maintenance.

2. Description of the Related Art

Due to constant weather changes temperature varies throughout the year in most locations. Such temperature variations cause rails of a railway track to move from its installed position. For example, longitudinal expansion in rail due to radiant heating by the sun in summer causes track distortion and buckling, but successive contraction in winter also causes breakage in the rails. This natural opposing behavior of the rails impacts operational safety and increases cost of track maintenance in places where drastic difference in temperature is encountered in a seasonal change under extreme weather conditions. Rail thermal expansion in track is a problem because heating of rails changes the shape of rails so a track structure ends with a perpetual movement.

One technique currently employed to cope with rail track expansion is rail anchoring and rail length adjusting by cutting and welding to maintain track stability. However, under the extreme heating and cooling cycles of certain days, thermal energy injected into railroad rail by the sun can cause severe thermal expansion. For example, using the values of: 0.12 BTU/lb.° F. as the specific heat ($C_p$) for rail steel, 45.3333 lb./ft. for a 1,500 ft. long 136 lb. rail, and a temperature change of 60° F., the change of stored internal energy within said 1500' section of rail will be: Q=45.3333 lb./ft.×1500 ft.×0.12 BTU/lb.° F.×60° F.=489,600 BTU (143.28 KWH).

This increase in stored thermal energy causes the steel of the rail to expand linearly. When a rail is free to move without restraint, it changes 0.0000065 inch per inch of its length per degree Fahrenheit change in temperature. For example, the unrestrained 1500' section of steel railroading rail used in the example above can expand up to 7.02 inches for a 60 degree increase in temperature.

Railroad rail used to be installed in 39 foot sections and the thermal expansion of the steel rail could be mitigated by expansion in the joints at each track section union. Using the above formula and a temperature change of 60° F., each 39 ft. section of rail can expect to expand: $\Delta L$=39 ft.×12 in length/ft.×0.0000065 in growth/in length×60° F. ($\Delta T$), $\Delta L$=0.183 in.

It can be seen that a reasonably sized expansion joint could accommodate such a small growth. However, railroad rail (non-transit) is now installed and welded together (further referred to as Continuous Welded Rail (CWR)) to minimize the disturbances created by the wheels crossing the rail joints. This allows for a smoother ride and less vibration related maintenance of the track and trains. With the elimination of rail joints, unrestrained thermal expansion can cause CWR sections to shift non-linearly, causing detrimental conditions for railroad operations and can lead to derailments and loss of time due to track maintenance.

For every 1° F. change in temperature, 195 psi of internal stress is set up in the rail by restraining forces, based on the stress-strain relationship of: Stress=0.0000065 in/in×30,000,000 psi×$\Delta T$° F. Consequently, to restrain a 136 lb. section of steel rail with a cross-sectional area of 0.0929 ft.$^2$ (13.3776 in.$^2$) and with a temperature change of 60° F.: Force=Area× 195 psi/° F.×$\Delta T$° F. Force=13.3776 in.$^2$×195 psi/° F.×60° F.=156,518 lbs. (78.26 tons).

When the rail is restrained in such a way that expansion is disallowed, its internal energy increases due to rise in temperature, and the force developed internally is compressive in nature. The rail is then said to be in compression. Catastrophic failure results in the form of lateral distortion (bulge). This phenomenon is called "rail buckling", or "sun kinks", and is the longitudinal shifting of sections of rail due to thermal expansion and substandard or deteriorated rail substrates.

The current attempts to remedy this issue focus on containing the internal forces caused by thermal heating and rail growth. This is accomplished by installing CWR under precise installation conditions and by lashing. Installers will pre-heat the rail sections to certain temperatures and install these sections at that temperature. This puts the rail in "pre-compression" when it is installed and the track rail will not grow when it is thermally heated. This installation technique results in the sections of rail being placed in tension (pulled) when they cool. This presents a problem in that tensioned rail is prone to breakage during cold weather. Trains passing over a tensioned section of rail can cause the steel to break and pull apart since it is tensioned. Other methods of mitigating the risk of rail buckling include painting the webbing of rail white to reflect solar energy, monitoring the temperature of the rail, and reducing operating speeds on the rails at certain ambient temperatures.

There are some other methods being investigated to help with rail buckling, for example, hard casing the ties in a concrete substrate. This is done because, in case of violent buckling, the substrate (ballast) is what gives out. The rails remain lashed to the ties but the ties and the ballast integrity fails under the lateral forces. Even using stronger substrate, given enough expansion forces, the lashing has a chance to fail, resulting in rail buckling.

Therefore, there is a need for improvements to handling of heating of rails, such as improvements in systems of cooling a rail when its thermal expansion leads to longitudinal shifting of sections of the rail.

SUMMARY

Briefly described, aspects of the present invention relate to cooling a rail of a railway track with a cooling module mounted on a side of the rail to counter problems associated with thermal expansion of the rail caused by the sun. In particular, a thermoelectric generator is mounted to the webbing of the rail to not only remove thermal energy from the rail by extracting heat but also to power an electric load associated with railways infrastructure by the thermoelectric generator to assist in track maintenance operations. For example, a railway infrastructure device or a wayside device such as an electronic circuit, a light source or a communication device may be powered. In this way, a potential rail thermal expansion indication can be detected and would be timely communicated by embodiments of a rail cooling or thermal energy removal system of the present invention. One of ordinary skill in the art appreciates that such a cooling system can be configured to be installed in different environments where such cooling is needed, for example, in railway installations.

In accordance with one illustrative embodiment of the present invention, a thermal energy removal system usable with a rail of a railway track is provided. The system comprises a cooling module configured to mount on a side of the rail to remove heat stored inside the rail. The cooling module includes a solid state electrical insulation sandwiched between a plate and a heat sink. The cooling module further includes a first terminal and a second terminal. The first and second terminals are configured to provide an electric energy source based on the heat extracted and harnessed for powering at least one of an electronic circuit, a light source, and a communication device associated with railways infrastructure.

In accordance with another illustrative embodiment of the present invention, a method of removing thermal energy from a rail of a railway track is provided. The method includes mounting a cooling module on a side of the rail to remove heat stored inside the rail, the cooling module including a solid state electrical insulation sandwiched between a plate and a heat sink and having first and second terminals. The method further includes providing an electric energy source at the first and the second terminals based on the heat extracted and harnessed for powering at least one of an electronic circuit, a light source, and a communication device associated with railways infrastructure.

In accordance with yet another illustrative embodiment of the present invention, a cooling module is provided for use with a rail of a railway track to remove thermal energy from the rail. The cooling module comprises a first thermoelectric generator configured to operate in a generation mode to power an electric load. The first thermoelectric generator includes a first solid state electrical insulation sandwiched between a first plate and a first heat sink. The cooling module further comprises a second thermoelectric generator configured to operate in a powered cooling mode by providing a cooling surface at the rail. The second thermoelectric generator includes a second solid state electrical insulation sandwiched between a second plate and a second heat sink.

In accordance with yet another illustrative embodiment of the present invention, a railway infrastructure system usable with a rail of a railway track is provided. The system comprises a wayside device and a power source coupled to the wayside device and the rail. The power source is configured to convert thermal energy from the rail into an electrical current to provide an electric energy source to the wayside device.

BRIEF DESCRIPTION OF THE DRAWINGS

FIG. 2 illustrates a schematic diagram of a thermoelectric generator (TEG) and a controller board in accordance with one illustrative embodiment of the present invention.

FIGS. 3A & 3B illustrate a schematic diagram of two operational modes of the TEG of FIG. 2 in accordance with one illustrative embodiment of the present invention.

FIG. 7 illustrates a flow chart of a method of removing thermal energy from the rail to power an electric load of railways infrastructure in accordance with an exemplary embodiment of the present invention.

DETAILED DESCRIPTION

To facilitate an understanding of embodiments, principles, and features of the present invention, they are explained hereinafter with reference to implementation in illustrative embodiments. In particular, they are described in the context of removing thermal energy from the rail to cool it and use the extracted or harnessed heat to drive an electric load such as a circuit, a light or a device. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

A thermal energy removal system is provided for cooling a rail of a railway track. The system comprises a cooling module configured to be mounted on a side of the rail to remove heat stored in the rail. The cooling module comprises first and second terminals. The first and second terminals provide an electric power source to power an electronic circuit, a light source, and/or a communication device associated with railways infrastructure.

Accordingly, a safety system is provided for a railway track being used by rail traffic which crosses over the rails laid for plying trains on them. In one embodiment, by measuring a degree or extent of thermal expansion of a rail during day relative to night based on a current flow measurement in a thermoelectric generator (TEG) an indication may be provided in advance prior to occurrence of a failure of rails such as of a potential rail buckling incidence so a maintenance action of adding extra cooling can be initiated prior to the incidence. This solution ensures safety of occupants of trains.

Figure 1:
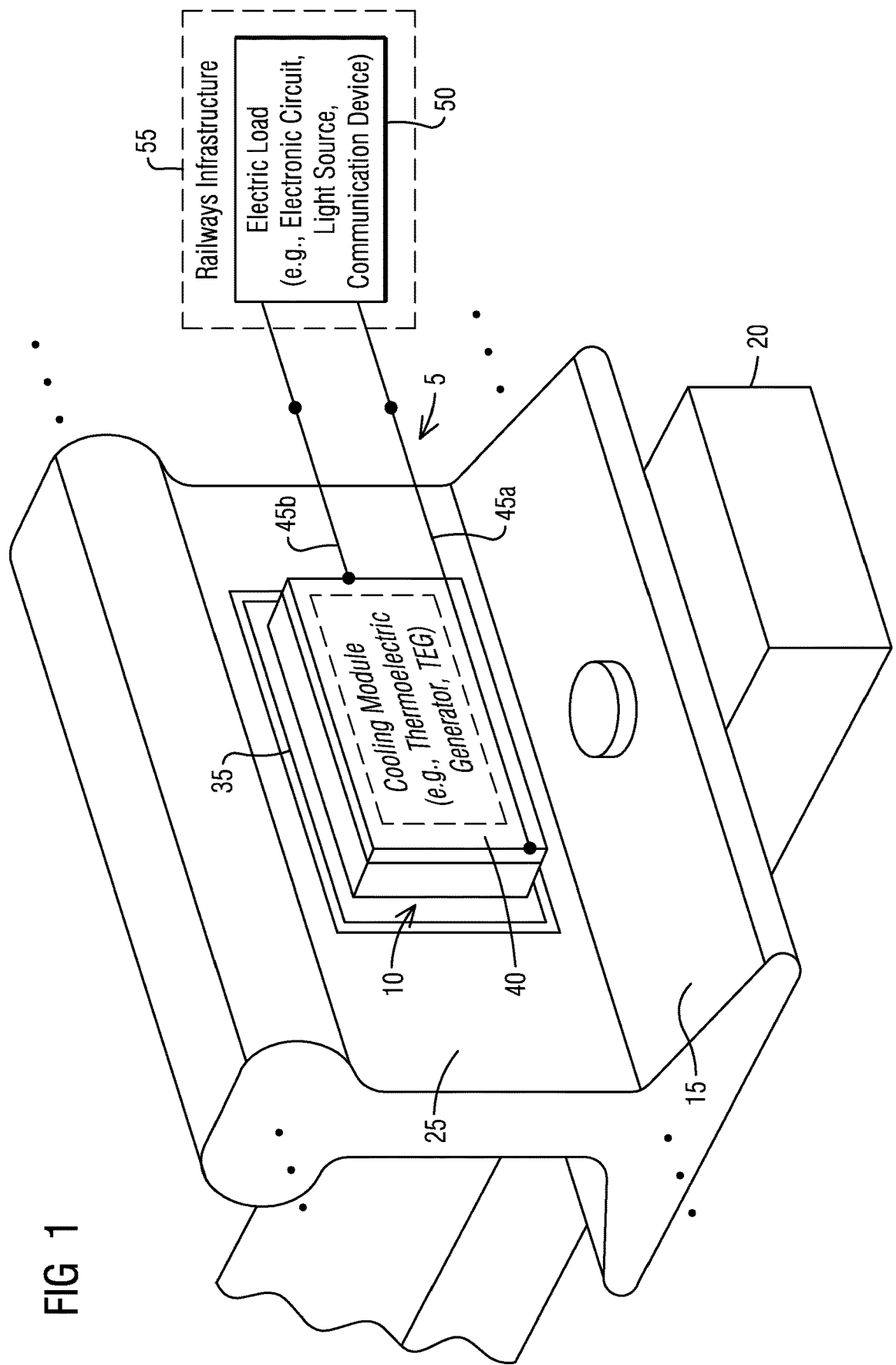
FIG. 1 illustrates a schematic diagram of a thermal energy removal system including a cooling module usable with a rail of a railway track in accordance with one illustrative embodiment of the present invention.

FIG. 1 illustrates a schematic diagram of a thermal energy removal system 5 including a cooling module 10 usable with a rail 15 of a railway track 20 in accordance with one illustrative embodiment of the present invention. The thermal energy removal system 5 can include multiple interacting systems, whether located together or apart, that together perform processes as described herein.

As used herein, the "cooling module" refers to a cooler, as described herein, that corresponds to a thermal energy extraction technique based on heat transfer due to a temperature gradient. The "cooling module," in addition to the exemplary hardware description above, refers to a device that is configured to extract and harness thermal energy to power a load, operated by a controller (including but not limited to a controller board, a point machine controller, and others). The "cooling module," may be capable of operating in multiple modes such as a self-powered configuration mode and/or an externally-powered configuration mode.

The cooling module 10 is configured to mount on a side 25 of the rail 15 to remove heat stored inside the rail 15. The cooling module 10 includes a solid state electrical insulation 30 sandwiched between a plate 35 and a heat sink 40.

Examples of the cooling module 10 include a thermoelectric generator (TEG) device. A TEG device is a solid state device that converts thermal energy into electrical energy by converting heat (temperature differences) directly into electrical energy, using a phenomenon called the Seebeck effect. Under the Seebeck effect, a temperature gradient in a conducting material results in heat flow which in turn results in the diffusion of charge carriers. The flow of charge carriers between a hot region and a cold region in turn creates a voltage difference. A typical efficiency of the TEG device is around 5-8%. TEG devices use highly doped semiconductors made from bismuth telluride ($Bi_2Te_3$), lead telluride (PbTe) or combination thereof.

A suitable TEG device model no. TEG2-07025HT-SS is available from Thermal Electronics Corp. located at 5 Furbacher Lane, Unit #4, Aurora, Ontario, Canada, L4G 6W2. A person skilled in the pertinent art would appreciate that other suitable TEGs may be readily deployed based on a specific implementation without departing from the scope of the present invention.

The cooling module 10 further includes a first terminal 45a and a second terminal 45b. The first and second terminals 45a, 45b to provide an electric energy source based on the heat extracted and harnessed for powering an electric load 50 such as an electronic circuit, a light source, and/or a communication device associated with railways infrastructure 55.

Examples of the railways infrastructure 55 include a point monitoring system deployed to monitor various parameters of a point machine. The point monitoring system may include a distributed array of sensors adapted to gather data regarding the status of elements of the installation with which the sensors are associated. The point monitoring system may utilize advanced algorithms to process the data for a variety of purposes including predicting failure of equipment, developing efficient maintenance schedules and managing railway assets in general.

The thermal energy removal system 5 may maintain a safe rail temperature which may eliminate rail buckling caused by the non-linear thermal expansion of CWR so rail safety will be increased. The thermal energy removal system 5 may provide decreased maintenance time and costs as reduced maintenance of railways reduces overall maintenance and rail replacement costs. That is, the thermal energy removal system 5 may reduce maintenance and operations costs by not having to replace sections of rail and substrates that are subject to rail buckling.

Reduced maintenance leads to higher throughput by elimination of railway outages for track replacement. In particular, the thermal energy removal system 5 may provide increased railway throughput due to reduced maintenance and replacement activities paired with lifted speed reduction requirement.

The thermal energy removal system 5 may provide increased railway safety as the hazard mitigation of rail expansion leads to fewer derailments and safety concerns.

By removing the pre-heating practice during the installation of the rail 15 when using the thermal energy removal system 5, the CWR sections can be installed faster and cheaper.

By utilizing a clamp on style modular system, installation of the thermal energy removal system 5 will be flexible and doesn't require any sections of the rail 15 to be removed or disturbed. Embodiments of the present invention can be integrated into currently deployed railways, allowing for operators to retrofit railways with a rail cooling solution.

Referring to FIG. 2, it illustrates a schematic diagram of a thermoelectric generator (TEG) 200 and a controller board 205 in accordance with one illustrative embodiment of the present invention. The TEG 200 is configured to mount on a webbing of the rail 15 of FIG. 1 to convert thermal energy 202 into electrical energy 204 (e.g., current I) by converting heat (temperature differences) directly into the electrical energy 204.

In one embodiment, the TEG 200 may include a thermal heat concentrator element 210 and a first metal interconnect 215 coupled to the thermal heat concentrator element 210. The TEG 200 further includes a p-type semiconductor 220 having free ends. One of the free ends of the p-type semiconductor 220 may be coupled to the first metal interconnect 215. The TEG 200 further includes an n-type semiconductor 225 having free ends. One of the free ends of the n-type semiconductor 225 is coupled to the first metal interconnect 215.

The TEG 200 further includes a second metal interconnect 230 coupled to another one of the free ends of the p-type semiconductor 220 and coupled to another one of the free ends of the n-type semiconductor 225. The TEG 200 further includes an insulating cold substrate 235 coupled to the second metal interconnect 230. A first terminal 240a and a second terminal 240b may be connected to the second metal interconnect 230 to receive an electric load 245.

In operation, a temperature gradient in a conducting material across the thermal heat concentrator element 210 and the insulating cold substrate 235 results in heat flow 250 which in turn results in the diffusion of charge carriers. The flow of charge carriers between a hot region 255 and a cold region 260 in turn creates a voltage difference across the first terminal 240a and the second terminal 240b to drive the electric load 245.

Consistent with one embodiment, the controller board 205 may be configured to utilize the Peltier effect and reverse the currents in the cooling module 10 or the TEG 200 to create a solid state cooler. The Peltier effect is a temperature difference created by applying a voltage between two electrodes connected to a piece of semiconductor material. The TEG 200 is useful to transfer heat from one medium to another medium. Under the Peltier effect, by running an electric current through a junction of two dissimilar conductors, depending on the direction of the current, the Peltier effect causes the TEG 200 to act as a heater or a cooler.

The controller board 205 may include a micro-controller 261 having an associated storage device 262 to store a control software and/or firmware 263 and power electronics circuitry 264. The micro-controller 261 may support a variety of embedded control interface applications. The controller board 205 may include multiple I/O points for I/O applications, combined with a multiple channel multi-bit A/D convertor, and buses. It should be appreciated that several other components may be included in the controller board 205. However, the function and use of such equipment for a power electronics application are well known in the art and are not discussed further.

The rail 15 of FIG. 1 under the hot sun is subject to all three forms of heating condition, i.e. radiation, conduction, and convection. The rail 15 tends to cool down to ambient temperature at night, but heats up rapidly by mid morning with a temperature difference as much as 60° F. in hot summer months. Actual rail temperature measured on a hot day is commonly found 25 to 35° F. higher than the air ambient temperature.

When the TEG 200 is attached to the rail 15, heat flow right angle to a contacting surface is established at the interface between the rail 15 webbing area and a conductor plate of the TEG 200. Since thermal energy naturally flows from high temperature to low temperature to maintain equilibrium, a continuous heat flow by conduction is established from the adjacent portion of the rail 15 to replenish heat loss in area closer to the portion of rail 15 in contact with the TEG 200. This process procreates an effect of a thermal or a heat gradient throughout the length of rail 15. Likewise, a thermal or a heat gradient may be established between the thermal heat concentrator element 210 and the insulating cold substrate 235 (e.g., the plate and the heat sink in FIG. 1).

According to one embodiment, the controller board 205 may be configured to determine a heat gradient 265 between the thermal heat concentrator element 210 and the insulating cold substrate 235 (e.g., the plate and the heat sink in FIG. 1) and operate the TEG 200 based on the heat gradient 265. The controller board 205 may further be configured to compare the heat gradient 265 with a threshold gradient 270 and operate the TEG 200 based on a difference between the heat gradient 265 and the threshold gradient 270.

As a common practice by most railroads, a desirable neutral temperature for rail-laying and rail restraining is usually in between 95° F. to 115° F. Accordingly, in one embodiment, the threshold gradient 270 may be set based on this temperature range of the rail 15.

Consistent with one embodiment, when the heat gradient 265 is less than the threshold gradient 270 the controller board 205 may be configured to operate the TEG 200 in a generation mode (see FIG. 3A) to power the electric load 245. Likewise, when the heat gradient 265 is more than the threshold gradient 270 the controller board 205 may be configured to operate the TEG 200 in a powered cooling mode (see FIG. 3B) by providing a cooling surface at the rail 15 of FIG. 1.

In the powered cooling mode, the TEG 200 may be either powered by a solar panel and battery system or an AC electrical power supply. The demand for power may be determined by a thermocouple attached to the rail 15. When the rail temperature reaches a pre-set value, power will turn on automatically and stay on to run the thermal energy removal system 5 until the temperature in the rail 15 drops down to an acceptable level. When solar power is chosen to energize the thermal energy removal system 5, the photovoltaic panel collects solar energy and transforms it into electrical energy, which may be stored in a battery bank of 12V DC configuration.

Actual temperature of the rail 15 in hot summer months normally reaches in between 135° F. to 145° F., although it may change from location to location. In one embodiment, the cooling effect from the TEG 200 is only required to bring the temperature of the rail 15 down by about 35° F., just to get in the range of a temperature when the rail 15 is first laid or in the range selected by a rail infrastructure operator.

While particular embodiments are described in terms of the cooling module 10 as a thermoelectric generator TEG 200, the techniques described herein are not limited to thermoelectric generator but can be also used with other cooling modules, such as different types of electric heat extractors or heat exchangers could be deployed.

FIGS. 3A & 3B illustrate a schematic diagram of two operational modes of the TEG 200 of FIG. 2 in accordance with one illustrative embodiment of the present invention. While the FIG. 3A illustrates a generation mode 300 of the TEG 200, the FIG. 3B illustrates a power cooling mode 325 of the TEG 200.

Referring to FIG. 3A, it illustrates the controller board 205 operating the TEG 200 in the generation mode 300 to power an electric load 305. In the generation mode 300, a temperature gradient in a conducting material across a heat source 310 and a cool side 320 results in heat flow which in turn results in the diffusion of −ve N charge carriers and +ve P charge carriers. The flow of −ve N charge carriers and +ve P charge carriers between the heat source 310 and the cool side 320 in turn creates a voltage difference across the electric load 305.

Referring to FIG. 3B, it illustrates the controller board 205 operating the TEG 200 in the power cooling mode 325 which is powered by a battery or a power source 330. In the power cooling mode 325, a temperature gradient in a conducting material across a dissipated heat surface 340 and a cooled surface 345 results in heat flow which in turn results in the diffusion of −ve N charge carriers and +ve P charge carriers. The flow of −ve N charge carriers and +ve P charge carriers between the dissipated heat surface 340 and the cooled surface 345 in turn adds a cooling source to the rail 15 of FIG. 1.

Figure 4:
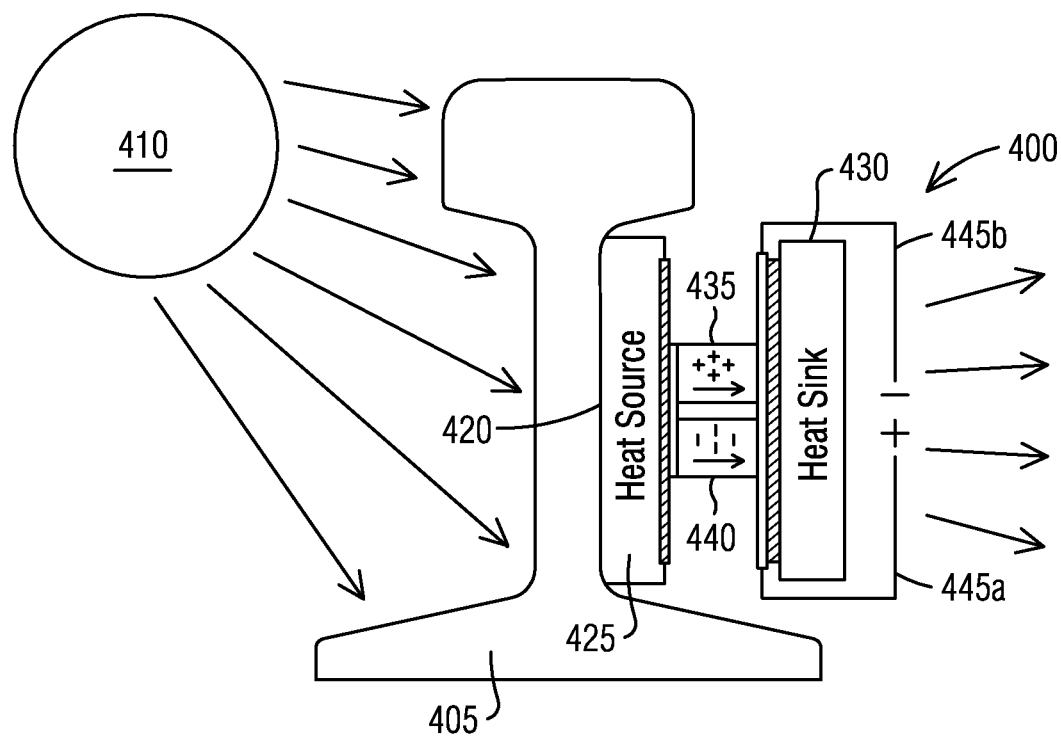
FIG. 4 illustrates a schematic diagram of mounting of the TEG of FIG. 2 on the rail in accordance with one illustrative embodiment of the present invention.

FIG. 4 illustrates a schematic diagram of mounting of a thermoelectric generator (TEG) 400 like that of FIG. 2 on a rail 405 in accordance with one illustrative embodiment of the present invention. Sun 410 heats up the rail 405 during a typical summer day which causes thermal expansion in the rail 405, leading to rail buckling. That is, unrestrained thermal expansion can cause CWR sections to shift non-linearly.

Accordingly, longitudinal expansion in rail due to radiant heating by the sun 410 in summer causes track distortion and buckling. Rail thermal expansion in the rail 405 is a problem because heating of the rail 405 changes shape of the rail 405. This behavior of the rail 405 impacts operational safety.

To this end, the TEG 400 may be mounted to a webbing 420 of the rail 415 by mounting means. Examples of mounting means include welding, fastening with screws, magnetic or adhesive epoxy etc. The TEG 400 reduces cost of track maintenance in places where drastic difference in temperature is encountered in a seasonal change under extreme weather conditions.

The TEG 400 may comprise a heat source element 425, a heat sink 430, a p-type semiconductor 435 and a n-type semiconductor 440. The heat source element 425 may be attached to the webbing 420 using one or more of the mounting means set forth above. A first terminal 445a and a second terminal 445b may provide a voltage source (V) to drive a current (I) into a detection electrical apparatus such as the electric load 245 associated with the railways infrastructure 55 of FIG. 1. Examples of the railways infrastructure 55 include a point monitoring system deployed to monitor various parameters of a point machine.

One method of mitigating the risk of rail buckling includes monitoring a temperature of the rail 405 using a thermocouple for the TEG 400. In this way, a potentially dangerous rail thermal expansion indication can be detected based on temperature monitoring and the TEG 400 may be selectively used. The dangerous rail thermal expansion indication is timely communicated via the TEG 400 by using the detection electrical apparatus associated with railways infrastructure 55 of FIG. 1.

In one embodiment, a measure of a level of thermal expansion of the rail 405 during day relative to night may be provided by measuring a current flow in the TEG 400. Such a current flow measurement in the TEG 400 being indicative of a temperature variation measurement may provide an advance indication prior to occurrence of a failure of the rail 405 such as due to a potential rail buckling incidence so a maintenance action of adding extra cooling (see FIG. 3B) can be initiated prior to the incidence.

Figure 5:
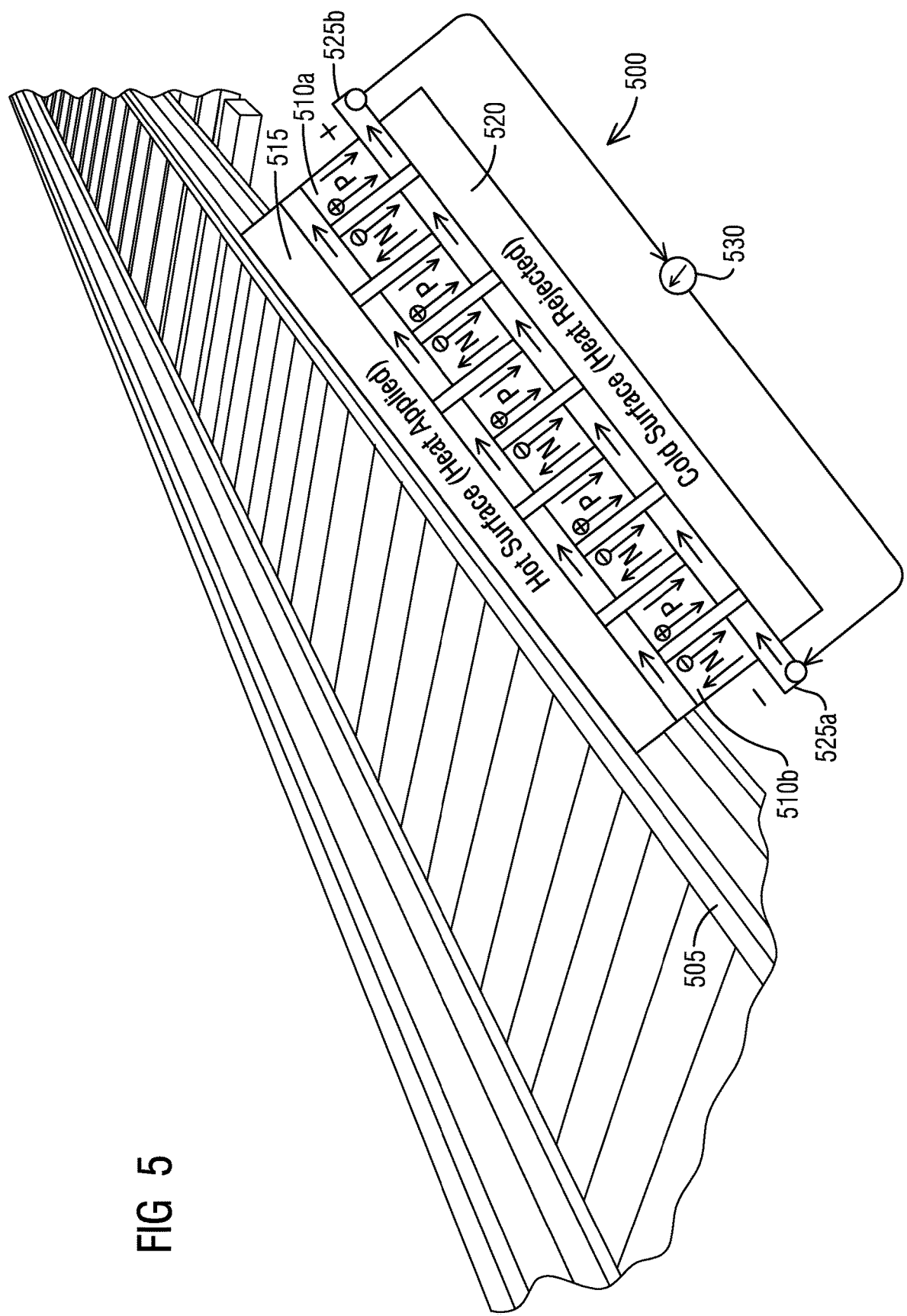
FIG. 5 illustrates a schematic diagram of a thermoelectric generator module placed along section of the rail in accordance with one illustrative embodiment of the present invention.

FIG. 5 illustrates a schematic diagram of a thermoelectric generator (TEG) module 500 placed along a section of a rail 505 in accordance with one illustrative embodiment of the present invention. For example, the TEG module 500 can be strategically placed along the section of rail 505 to remove thermal heat and store it to drive electronics, lights, communications, etc. By removing most of the thermal energy from the rail 505, the TEG module 500 cools it sufficiently to avoid dangerous levels of distortion or buckling.

According to one embodiment, the TEG module 500 may be formed by connecting a series of the TEG 200s of FIG. 2. An array of the TEG modules 500 may be distributed along the CWR sections of the rail 505 to substantially cool it to a temperature 95° F. to 115° F. well below a high temperature 135° F. to 145° F. which causes significant distortion and buckling in the rail 505.

In one embodiment, the TEG module 500 may include pairs of p-type and n-type semiconductors 510a, 510b disposed adjacent to each other to form a longitudinal block that can be linearly mounted on the webbing of the rail 505. The TEG module 500 may further include a hot surface element 515 to which heat is applied by the rail 505 such as during hot summer days. On an opposing side, the TEG module 500 may include a cold surface element 520 by which the heat is rejected by dissipation.

The TEG module 500 further includes a first terminal 525a and a second terminal 525b. The first and second terminals 525a, 525b may provide an electrical energy source based on the heat extracted and harnessed to drive an electric load 530 such as an electronic circuit, a light source, and/or a communication device associated with the railways infrastructure 55. One example of the railways infrastructure 55 is a point monitoring system.

The TEG module 500 not only removes thermal energy from the rail 505 by extracting heat but also can power the electric load 530 associated with the railways infrastructure 55 to assist in track maintenance operations. With the removal of the thermal energy by the TEG module 500 from the rail 505 unrestrained thermal expansions of CWR sections may not occur and they may not significantly shift non-linearly. In this way, the TEG module 500 may avoid detrimental conditions for railroad operations which can lead to derailments and avoid loss of time due to track maintenance.

Figure 6:
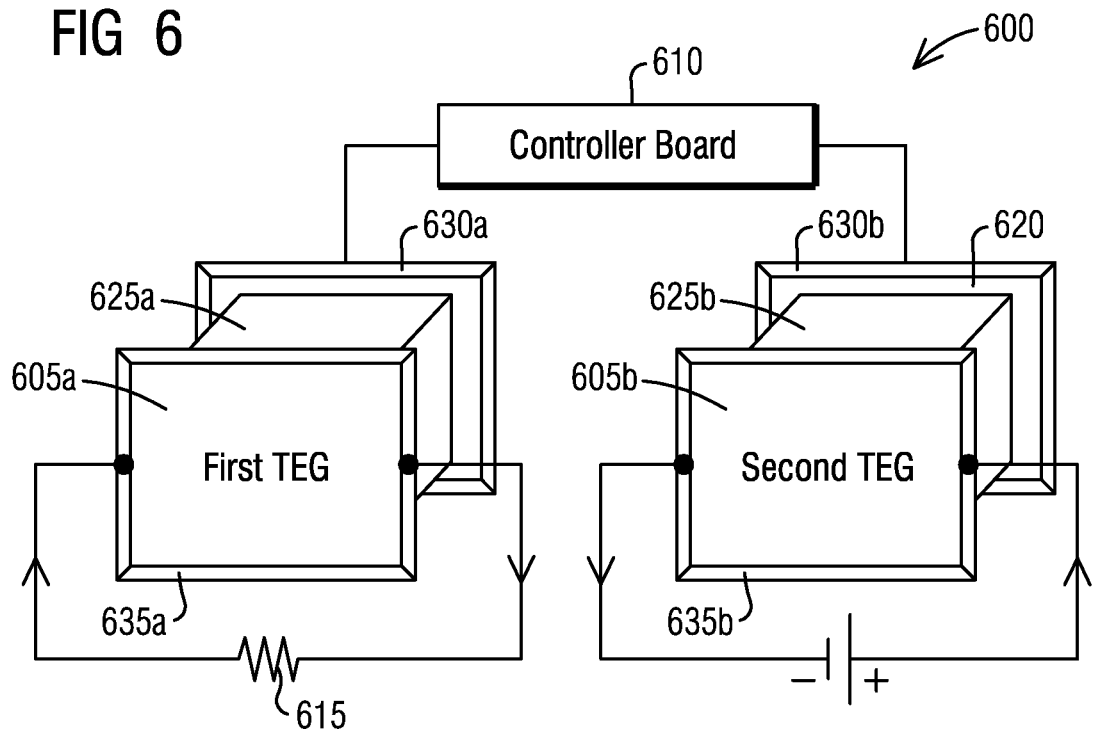
FIG. 6 illustrates a schematic diagram of a thermoelectric generator module including first and second TEGs and a controller board in accordance with one illustrative embodiment of the present invention.

FIG. 6 illustrates a schematic diagram of a cooling module such as a thermoelectric generator (TEG) module 600 including first and second TEGs 605a, 605b and a controller board 610 in accordance with one illustrative embodiment of the present invention. The TEG module 600 is provided for use with a rail of a railway track to remove thermal energy from the rail. While the first TEG 605a is configured to operate in a generation mode (see FIG. 3A) to power an electric load 615, the second TEG 605b is configured to operate in a powered cooling mode (see FIG. 3B) by providing a cooling surface 620 at the rail.

The first TEG 605a includes a first solid state electrical insulation 625a sandwiched between a first plate 630a and a first heat sink 635a. The second TEG 605b includes a second solid state electrical insulation 625b sandwiched between a second plate 630b and a second heat sink 635b.

The controller board 610 is coupled to both the first TEG 606a and the second TEG 605b to control their operational modes. The controller board 610 is configured to determine a heat gradient between the first plate 630a and the first heat sink 635a and operate the second TEG 605b simultaneously with the first TEG 605a only when the heat gradient is being greater than a threshold gradient.

In another embodiment however, the controller board 610 may operate both the first TEG 606a and the second TEG 605b simultaneously irrespective of the heat gradient. In another alternate embodiment, the controller board 610 may operate the second TEG 605b based on some other user criteria such as operate the second TEG 605b only during certain time periods of a given day.

FIG. 7 illustrates a flow chart of a method 700 of removing thermal energy from the rail 15 to power the electric load 50 of the railways infrastructure 55 in accordance with an exemplary embodiment of the present invention. Reference is made to the elements and features described in FIGS. 1-6. It should be appreciated that some steps are not required to be performed in any particular order, and that some steps are optional.

In step 705, the cooling module 10 may be mounted on the side of the rail 15. The cooling module 10, in step 710, may provide on first and second terminals a voltage to supply a current to an electric load which may be a sensor or a detection device capable of indicating a temperature or heating related indication locally or transmit it to a remote location where the temperature or the heating is monitored for safety or maintenance purposes. In other words, the controller board 205 may operate the cooling module 10 in a generation mode.

The controller board 205, in step 715, may determine the heat gradient 265 between the plate 35 and the heat sink 40 of the cooling module 10. At a decision point 720 next, the controller board 205 may compare the heat gradient 265 to the threshold gradient 270 to determine whether it is greater than the threshold gradient 270. If the answer is yes (Y) the controller board 205 may, in step 725, reverse the current in the cooling device 10 and operate it in a powered cooling mode by adding a cooling surface to the rail 15. If however the answer is no (N) the controller board 205 may loop to monitor the heat gradient 265 relative to the threshold gradient 270.

Additionally, a control system may be paired with the controller board 205 to add a cooling surface to the rail 15 and extract even more energy from the rail 15 in times of extreme heat and rail thermal expansion. The TEG modules 500, by way of reversing the module current, may be externally-powered to act as a surface mounted cooler to remove extreme levels of thermal energy stored in the rail 15. The TEG modules 500 may operate as cooling devices like a Peltier cooler in emergency situations. Alternately, the TEG modules 500 may also be externally-powered to operate as a rail heater if there is a chance of extreme cold temperatures resulting in high tensioning and breakage. These externally-powered cooling systems may be solar powered or grid tied if desired and may contain a battery backup for energy storage.

Embodiments of the present invention will allow railroad owners to reduce or eliminate the issue of rail buckling. If a control system is coordinated appropriately, it will result in a self-powering system that would require no operational costs to the owners. Railroad owners would also experience greater safety, decreased maintenance costs, and higher throughput on their railways. With known installation methods, the embodiments of the present invention may provide a retrofit solution, requiring no removal of installed railway infrastructure.

Embodiments of the present invention may increase the overall safety and reliability of railroading by providing a solution that leads to reduced maintenance costs and higher throughput (from the reduced maintenance) for all railroad operations that use CWR.

Referring back to FIG. 1, in one embodiment, the thermal energy removal system 5 may be self-sustaining as the excess energy produced by the thermoelectric generator (TEG) 200 may be stored in a battery to power a control system in the event additional powered cooling is required. The stored energy may also power a temperature monitor, communications equipment, etc. The thermal energy removal system 5 may be maintenance free as the solid state design of the TEG modules 500 removes the maintenance requirements of other systems having moving parts.

In one embodiment, a railway infrastructure system usable with a rail of a railway track is provided. The system comprises a wayside device and a power source coupled to the wayside device and the rail. The power source is configured to convert thermal energy from the rail into an electrical current to provide an electric energy source to the wayside device. The power source may be a primary power source of the railway infrastructure system. Alternatively, the power source may be a secondary power source of the railway infrastructure system. In one embodiment, the power source is the only one power source of the railway infrastructure system. The power source may be a cooling module configured to mount on a side of the rail to remove heat stored inside the rail. The cooling module may include a solid state electrical insulation sandwiched between a plate and a heat sink, a first terminal and a second terminal. The first and second terminals may be configured to provide an electric energy source based on the heat extracted and harnessed for powering the wayside device. In another embodiment, the power source may be a thermoelectric generator.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

Although the steps, operations, or computations may be presented in a specific order, this order may be changed in different embodiments. In some embodiments, to the extent multiple steps are shown as sequential in this specification, some combination of such steps in alternative embodiments may be performed at the same time.

Embodiments described herein can be implemented in the form of control logic in software or hardware or a combination of both. The control logic may be stored in an information storage medium, such as a computer-readable medium, as a plurality of instructions adapted to direct an information processing device to perform a set of steps disclosed in the various embodiments. Based on the disclosure and teachings provided herein, a person of ordinary skill in the art will appreciate other ways and/or methods to implement the invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A thermal energy removal system usable with a rail of a railway track, the system comprising:
   a cooling module configured to mount on a webbing of the rail to remove heat stored inside the rail, the cooling module including:
      a solid state electrical insulation sandwiched between a plate and a heat sink;
      a first terminal; and
      a second terminal, wherein the first and second terminals are configured to provide an electric energy source based on the heat extracted and harnessed for powering a railway infrastructure device, wherein the cooling module is a thermoelectric generator, the cooling module further comprising:
   a controller board configured to:
   determine a heat gradient between the plate and the heat sink and operate the thermoelectric generator based on the heat gradient, and
   measure a level of thermal expansion of the rail based on a comparison of measurements of a current flow across the thermoelectric generator at different times and provide an indication of an increased risk of a rail failure.

2. The system of claim 1, wherein the cooling module is the thermoelectric generator, the thermoelectric generator including:
   a thermal heat concentrator element,
   a first metal interconnect coupled to the thermal heat concentrator element,
   a p-type semiconductor having free ends, wherein one of the free ends of the p-type semiconductor is coupled to the first metal interconnect,
   an n-type semiconductor having free ends, wherein one of the free ends of the n-type semiconductor is coupled to the first metal interconnect,
   a second metal interconnect coupled to another one of the free ends of the p-type semiconductor and coupled to another one of the free ends of the n-type semiconductor; and
   an insulating substrate coupled to the second metal interconnect, wherein the first terminal and the second terminal connected to the second metal interconnect to receive an electric load.

3. The system of claim 1, wherein the cooling module is a thermoelectric generator, the cooling module further comprising the controller board configured to utilize the Peltier effect and reverse the currents in the cooling module to create a solid state cooler, wherein the railway infrastructure device is at least one of an electronic circuit, a light source, and a communication device associated with railways infrastructure.

4. The system of claim 3, wherein the controller board is configured to operate the thermoelectric generator in a powered cooling mode by adding a cooling surface to the rail.

5. The system of claim 1, wherein the cooling module is a thermoelectric generator, the cooling module further comprising the controller board configured to operate the thermoelectric generator in a generation mode to power an electric load.

6. The system of claim 1, wherein the controller board is configured to compare the heat gradient with a threshold gradient and operate the thermoelectric generator based on a difference between the heat gradient and the threshold gradient.

7. The system of claim 6, wherein when the heat gradient is less than the threshold gradient the controller board is configured to operate the thermoelectric generator in a generation mode to power an electric load.

8. The system of claim 6, wherein when the heat gradient is more than the threshold gradient the controller board is configured to operate the thermoelectric generator in a powered cooling mode by providing a cooling surface at the rail.

9. The system of claim 1, wherein the cooling module including:
   a first thermoelectric generator configured to operate in a generation mode to power an electric load; and
   a second thermoelectric generator configured to operate in a powered cooling mode by providing a cooling surface at the rail.

* * * * *